US010886041B2

(12) United States Patent
Tosaka et al.

(10) Patent No.: US 10,886,041 B2
(45) Date of Patent: Jan. 5, 2021

(54) HIGH-TEMPERATURE SUPERCONDUCTING CONDUCTOR, HIGH-TEMPERATURE SUPERCONDUCTING COIL, AND CONNECTING STRUCTURE OF HIGH-TEMPERATURE SUPERCONDUCTING COIL

(71) Applicant: KABUSHIKI KAISHA TOSHIBA, Minato-Ku (JP)

(72) Inventors: Taizo Tosaka, Yokohama (JP); Hiroshi Miyazaki, Yokohama (JP); Yasumi Ootani, Yokosuka (JP); Sadanori Iwai, Kawasaki (JP); Shigeki Takayama, Yokohama (JP); Kenji Tasaki, Nakano (JP); Kei Koyanagi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 514 days.

(21) Appl. No.: 15/761,530

(22) PCT Filed: Sep. 16, 2016

(86) PCT No.: PCT/JP2016/077464
§ 371 (c)(1),
(2) Date: Mar. 20, 2018

(87) PCT Pub. No.: WO2017/057064
PCT Pub. Date: Apr. 6, 2017

(65) Prior Publication Data
US 2018/0350489 A1    Dec. 6, 2018

(30) Foreign Application Priority Data

Sep. 28, 2015 (JP) .................................. 2015-190318

(51) Int. Cl.
*H01B 12/08* (2006.01)
*H01F 6/06* (2006.01)
(Continued)

(52) U.S. Cl.
CPC ............... *H01B 12/08* (2013.01); *H01F 6/06* (2013.01); *H01L 39/04* (2013.01); *H01L 39/143* (2013.01); *H01R 4/625* (2013.01); *Y02E 40/60* (2013.01)

(58) Field of Classification Search
CPC ........... H01B 12/08; H01F 6/06; H01L 39/04; H01L 39/143
See application file for complete search history.

(56) References Cited

U.S. PATENT DOCUMENTS 6,765,151 B2    7/2004 Fritzemeier et al.
6,784,362 B1    8/2004 Buczek et al.
(Continued)

FOREIGN PATENT DOCUMENTS

JP    2003-505848 A    2/2003
JP    2003-505887 A    2/2003
(Continued)

OTHER PUBLICATIONS

English translation of the International Preliminary Report on Patentability and Written Opinion of the International Searching Authority dated Apr. 3, 2018 in PCT/JP2016/077464 filed Sep. 16, 2016, 6 pages.
(Continued)

*Primary Examiner* — Paul A Wartalowicz
(74) *Attorney, Agent, or Firm* — Oblon, McClelland, Maier & Neustadt, L.L.P.

(57) ABSTRACT

In a high-temperature superconducting conductor 10, a laminated body 15 is formed by laminating a high-temperature superconducting layer 14 on one side surface of a
(Continued)

flexible and tape-shaped metal substrate 12 via an intermediate layer 13, and a plurality of thin film wires 11 are formed by providing a stabilization layer 17 around the laminated body 15 via a protective layer 16 and are arranged in a thickness direction. The plurality of thin film wires 11 are connected at both ends in a width direction to each other in a conductible state in a longitudinal direction by means of conductive coupling member 20, in such a manner that a thin film wire 11 disposed at an outermost side is positioned with a surface 18 on a side of the metal substrate 12 directed outward and a surface 19 of each of the plurality of thin film wires 11 facing the high-temperature superconducting layer 14 is held in a non-fixed state with respect to an opposing surface.

8 Claims, 11 Drawing Sheets

(51) Int. Cl.
*H01L 39/14* (2006.01)
*H01L 39/04* (2006.01)
*H01R 4/62* (2006.01)

(56) References Cited

U.S. PATENT DOCUMENTS

| | | | |
|---|---|---|---|
| 2002/0144838 | A1 | 10/2002 | Fritzemeier et al. |
| 2006/0073979 | A1 | 4/2006 | Thieme et al. |
| 2014/0155269 | A1* | 6/2014 | Daibo ............... H01L 39/143 505/211 |

FOREIGN PATENT DOCUMENTS

| | | |
|---|---|---|
| JP | 2008-244249 A | 10/2008 |
| JP | 2009-503794 A | 1/2009 |
| JP | 2011-3494 A | 1/2011 |
| JP | 2011-113933 A | 6/2011 |
| JP | 2012-033947 A | 2/2012 |
| JP | 2012-169237 A | 9/2012 |
| JP | 2013-232297 A | 11/2013 |
| JP | 2013-247291 A | 12/2013 |
| JP | 2014-17090 A | 1/2014 |

OTHER PUBLICATIONS

International Search Report dated Nov. 15, 2016 in PCT/JP2016/077464, filed on Sep. 16, 2016.

* cited by examiner

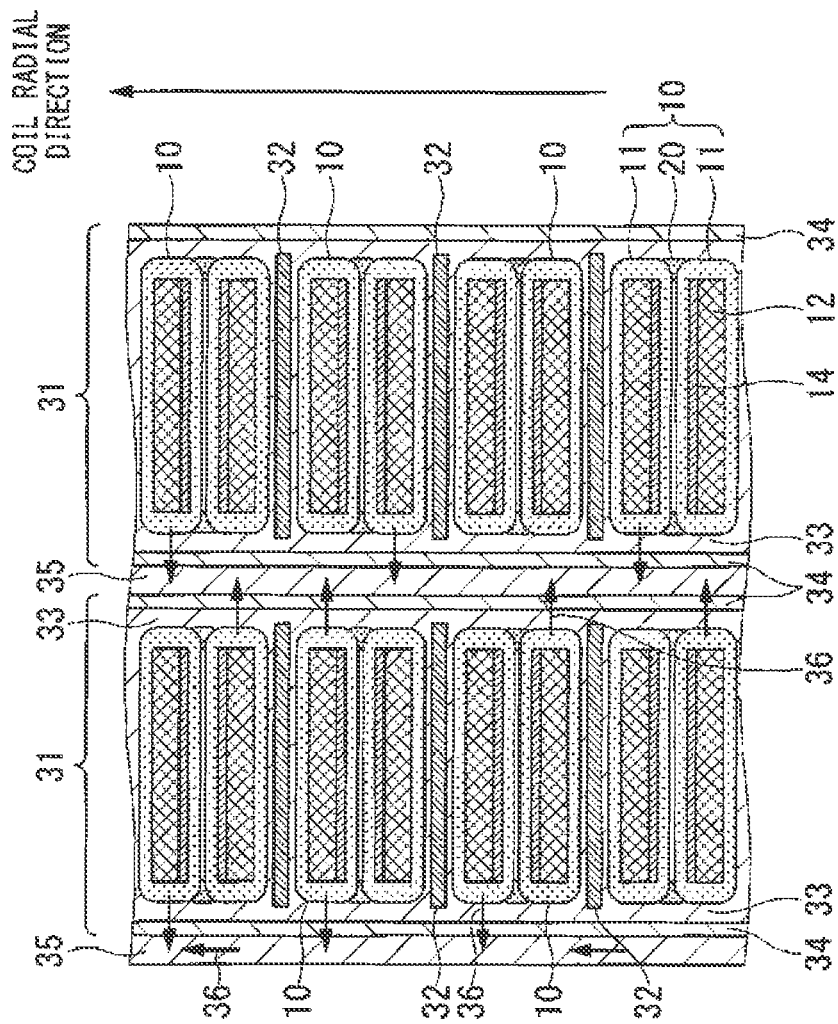
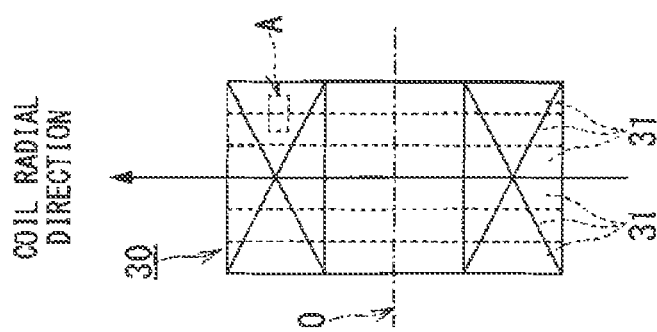
FIG. 6B
FIG. 6A

HIGH-TEMPERATURE SUPERCONDUCTING CONDUCTOR, HIGH-TEMPERATURE SUPERCONDUCTING COIL, AND CONNECTING STRUCTURE OF HIGH-TEMPERATURE SUPERCONDUCTING COIL

FIELD

Embodiments of the present invention relate to a high-temperature superconducting conductor equipped with a high-temperature superconducting layer, a high-temperature superconducting coil equipped with the high-temperature superconducting conductor, and a connecting structure of the high-temperature superconducting coil.

BACKGROUND

A high-temperature superconductive thin film wire material (i.e., thin film wire) includes a rare earth (RE) metal such as yttrium (Y) and gadolinium (Gd), and is a material obtained by forming a high-temperature superconducting layer having a composition represented by (RE) $Ba_2Cu_3O$—into a wire. This thin film wire has a structure in which an intermediate layer is laminated on a metal substrate having a thickness of approximately 100 μm and a high-temperature superconducting layer is laminated on the intermediate layer. The intermediate layer is a thin film layer having a thickness of approximately several μm in which crystals such as $CeO_2$ and MgO are biaxially oriented, and the high-temperature superconducting layer is a layer having a thickness of approximately several μm in which crystals are biaxially oriented. In a practical thin film wire, a protective layer such as silver is generally applied to the surface of the high-temperature superconducting layer and a stabilization layer of, e.g., copper is generally formed on the outside of the high-temperature superconducting layer for bypassing electric current in the case of normal conducting transition.

Such a thin film wire has a feature that the current capacity under high magnetic field is large and stress resistance characteristic in the longitudinal direction are excellent. Hence, it is expected that a high-temperature superconducting coil with high current density and high stress necessary for generating high magnetic field can be realized, and development has been made for applying such a high-temperature superconducting coil to, e.g., an MRI magnet, a single crystal pulling apparatus magnet, an accelerator magnet.

It is known that a thin film wire has a high allowable stress when a mechanical load is applied in its longitudinal direction, whereas it is also known that the high-temperature superconducting layer of the thin-film wire is destroyed by a very weak stress against the direction (i.e., peeling direction) of peeling off the laminated intermediate layer and/or the high-temperature superconducting layer. For instance, when a thin film wire is wound and impregnated with resin, a force in the peeling direction acts on the thin film wire due to, e.g., thermal stress during cooling, and various countermeasures against it have been proposed.

For instance, a structure of covering the outer surface of the thin film wire with a cover member made of a metal tape is disclosed as a structure in which a force in the peeling direction acting on the high-temperature superconducting layer from the outside is shared by another member. Other structures are also disclosed as the structure of the same purpose as described above, such as a structure of bonding two thin film wires on the superconducting layer side and a structure in which two thin film wires are connected on the metal substrate side and covered with a conductive structure. Further, there is disclosed a structure in which a reinforcing tape line is disposed so as to surround the periphery of the thin film wire and the reinforcing tape wire and the thin film wire are separated from each other. Additionally, there is disclosed a structure in which a stabilization layer (i.e., stabilization material) having a hollow portion is bonded to the thin film wire, and there is also disclosed a structure in which the thin film wire is hermetically sealed with a sheet of, e.g., copper.

As a structure for preventing the force in the peeling direction from acting on the high-temperature superconducting layer, for instance, there is disclosed a structure in which stress in the peeling direction does not act by providing a release material around the wire. As another structure of the same purpose, there is disclosed a structure in which the thin film wire and a reinforcing plate are surrounded with an insulating tape to be restrained and a release material is provided on a surface where the thin film wire and the reinforcing plate are in sliding contact with each other. As still another structure of the same purpose, there is disclosed a structure in which the thin film wire and the releasing tape are wound together.

PRIOR ART DOCUMENT

Patent Document

[Patent Literature]
[Patent Document 1] Japanese Unexamined Patent Application Publication No. 2012-169237
[Patent Document 2] Japanese Translation of PCT International Application Publication No. JP-T-2003-505887
[Patent Document 3] Japanese Translation of PCT International Application Publication No. JP-T-2009-503794
[Patent Document 4] Japanese Unexamined Patent Publication No. 2011-3494
[Patent Document 5] Japanese Unexamined Patent Application Publication No. 2013-232297
[Patent Document 6] Japanese Translation of PCT International Application Publication No. JP-T-2003-505848
[Patent Document 7] Japanese Unexamined Patent Application Publication No. 2008-244249
[Patent Document 8] Japanese Unexamined Parent Application Publication No. 2011-113933
[Patent Document 9] Japanese Unexamined Patent Application Publication No. 2012-33947

SUMMARY OF THE INVENTION

Problem to be Solved by the Invention

In the high-temperature superconducting coil produced by winding a thin film wire and impregnating it with resin, various structures for preventing peeling of the thin film wire are disclosed as described above. However, the respective structures have the following problems.

In the structure of additionally providing a reinforcing member with respect to the force in the peeling direction acting on the high-temperature superconducting layer from the outside, the force in the peeling direction acting on the high-temperature superconducting layer cannot be completely reduced to zero and thus the high-temperature superconducting layer may be damaged.

In the structure in which the outside of the thin film wire is covered with a reinforcing tape or a stabilization material having a hollow portion inside is added in order to prevent the force in the peeling direction from being transmitted to the high-temperature superconducting layer, there is a problem that the cross-sectional area of the thin film wire increases by an amount corresponding to the addition of the reinforcing tape or the stabilization material and the critical current density in this cross-section decreases.

Further, in the case of a method of disposing a release material around the thin film wire and in the case of a structure of constraining the thin film wire with an insulating tape, there is a problem that it becomes difficult to apply a "non-insulated coil" as a protection measure for the high-temperature superconducting coil. Although a non-insulated coil reduces an electric current in a portion transferred to normal conduction by electrically connecting the adjacent winding turns, the function as a non-insulated coil will be lost when the winding turns are electrically insulated by the release material and/or the insulating tape.

In view of the above-described problem, an object of the present invention is to provide a high-temperature superconducting conductor that can ensure a satisfactory critical current density and prevent breakage of a high-temperature superconducting layer against a mechanical load so as to secure reliability.

Another object of the present invention to provide a high-temperature superconducting coil that can secure satisfactory superconducting characteristics against a mechanical load generated according to a manufacturing process and/or a use situation.

Still another object of the present invention to provide a connecting structure of a high-temperature superconducting coil that can satisfactorily connect a high-temperature superconducting conductor of a high-temperature superconducting coil to a metal conductor with a low electric resistance value.

Means for Solving Problem

In a high-temperature superconducting conductor in which a laminated body is formed by laminating a high-temperature superconducting layer on one side surface of a flexible and tape-shaped metal substrate via an intermediate layer, and a plurality of thin film wires are formed by providing a stabilization layer around the laminated body via a protective layer and are arranged in a thickness direction. In the high-temperature superconducting conductor, the plurality of thin film wires are connected at both ends in a width direction to each other in a conductible state in a longitudinal direction, in such a manner that a thin film wire disposed at an outermost side is positioned with a surface on a side of the metal substrate directed outward and a surface of each of the plurality of thin film wires facing the high-temperature superconducting layer is held in a non-fixed state with respect to an opposing surface.

A high-temperature superconducting coil features that each winding turn of the high-temperature superconducting conductor is fixed by impregnation with an insulating resin.

A connecting structure of the high-temperature superconducting coil is configured by connecting a lengthwise end portion of the high-temperature superconducting conductor constituting the high-temperature superconducting coil to a metal conductor via a silver sheath wire that is formed by embedding a high-temperature superconducting filament in a silver matrix.

Effect of Invention

According to the present invention, a high-temperature superconducting conductor in which plural thin film wires are arranged in the thickness direction is configured such that the thin film wire arranged at the outermost side is positioned with its surface on the metal substrate side facing outward and the surface of each thin film wire on the high-temperature superconducting layer side is held in a non-fixed state with respect to the opposing surface. Thus, when a mechanical load is externally applied to the high-temperature superconducting conductor, it can be suppressed that this load acts on the high-temperature superconducting layer of each thin film wire as a force in the peeling direction. As a result, it is possible to provide a high-temperature superconducting conductor that can prevent breakage of the high-temperature superconducting layer against a mechanical load from the outside and can secure reliability of the high-temperature superconducting conductor. Hence, even when a high-temperature superconducting coil formed by winding this high-temperature superconducting conductor around a winding frame (i.e., bobbin) is subjected to a mechanical load during its manufacture or use, it is possible to provide a high-temperature superconducting coil capable of securing satisfactory superconducting characteristics of the high-temperature superconducting coil.

In addition, a high-temperature superconducting conductor, in which plural thin film wires are arranged in the thickness direction, is constituted by connecting the plural thin film wires at both ends in the width direction to each other in a conductible state in the longitudinal direction. Accordingly, the proportion of the components other than the thin film wires is small in the cross-sectional area that is perpendicular to the longitudinal direction of the high-temperature superconducting conductor. As a result, it is possible to provide a high-temperature superconducting conductor that can secure satisfactory critical current density of the high-temperature superconducting conductor without lowering the critical current density.

Further, the lengthwise end portion of the high-temperature superconducting conductor of the high-temperature superconducting coil is connected to a metal conductor via a silver sheath wire and the connection length becomes substantially long. Thus, it is possible to provide a connecting structure of a high-temperature superconducting coil that can connect the high-temperature superconducting conductor of the high-temperature superconducting coil to the metal conductor with a low electric resistance value.

BRIEF DESCRIPTION OF DRAWINGS

FIG. 6A is an overall cross-sectional view illustrating one embodiment of a high-temperature superconducting coil according to the present invention.

FIG. 6B is an enlarged cross-sectional view illustrating the part A of FIG. 6 (A) in an enlarged manner.

DESCRIPTION OF EMBODIMENTS

Hereinafter, embodiments of the present invention will be described with reference to the accompanying drawings.

[A] First Embodiment (FIG. 1 to FIG. 5)

Figure 1:
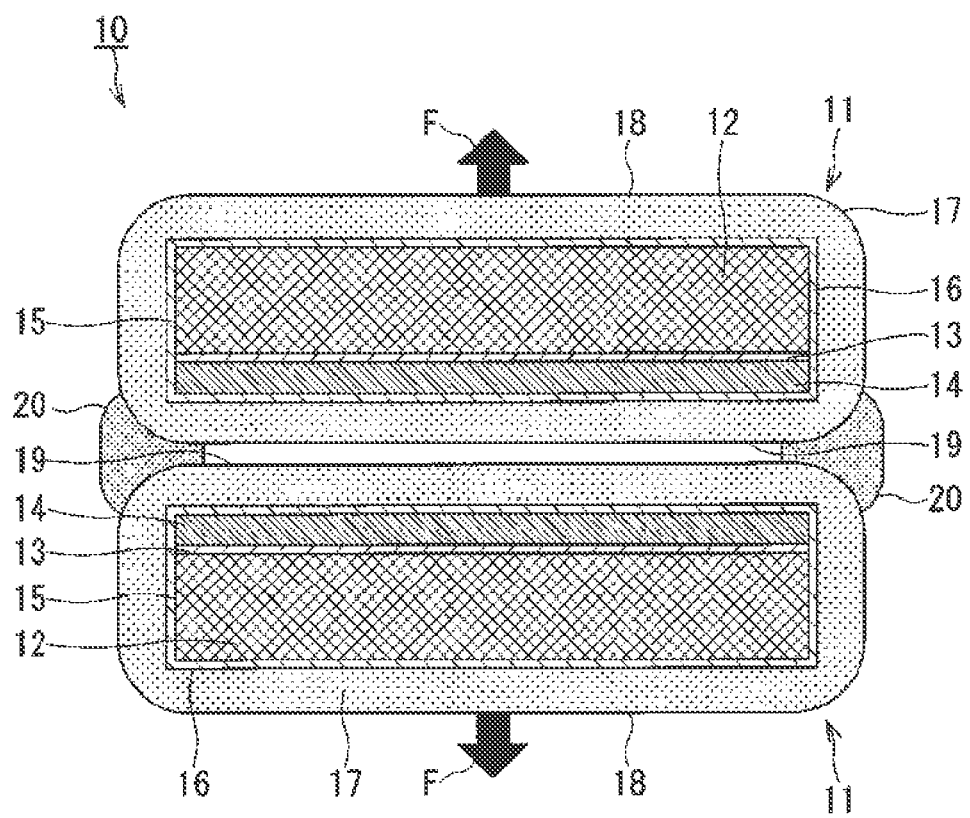
FIG. 1 is a transverse sectional view perpendicular to a longitudinal direction for illustrating one embodiment of a high-temperature superconducting conductor according to the present invention.

FIG. 1 is a transverse sectional view perpendicular to a longitudinal direction for illustrating one embodiment of a high-temperature superconducting conductor according to the present invention. As shown in FIG. 1, the high-temperature superconducting conductor 10 of the first embodiment is configured by arranging plural (e.g., two) high-temperature superconducting thin film wire materials (hereinafter referred to as the thin film wires) 11 in an elongated shape in the thickness direction.

In each thin-film wire 11, a laminated body 15 is formed by laminating a high-temperature superconducting layer 14 on one side surface of a flexible and tape-shaped metal substrate 12 with an intermediate layer 13 interposed therebetween, and each thin-film wire 11 is formed by providing a stabilization layer 17 around the laminated body 15 with a protective layer 16 interposed therebetween. Here, the intermediate layer 13 and the protective layer 16 are not shown in FIG. 3 to FIG. 9B.

The metal substrate 12 is a high-strength metal such as a Ni-based alloy. In addition, the intermediate layer 13 is an electrically insulating layer such as $CeO_2$ and MgO. Further, the high-temperature superconducting layer 14 is a superconducting layer containing a rare earth metal (RE) such as yttrium (Y) and gadolinium (Gd) and having a composition represented by $(RE)Ba_2Cu_3O-$. Moreover, the protective layer 16 is a layer of a noble metal such as silver. Furthermore, the stabilization layer 17 is a layer made of a low resistance metal such as copper.

In the case of the high-temperature superconducting conductor 10 of the present embodiment, the two thin film wires 11 disposed on the outermost side are arranged such that their respective surfaces 18 on the side of the metal substrate 12 face outward. Additionally, the high-temperature superconducting conductor 10 is configured such that the respective surfaces 19 of the two thin-film wires 11 on the side of the high-temperature superconducting layer 14 are held in a non-fixed state with respect to the surface facing thereto (i.e., in the case of the present embodiment, the respective surfaces 19 of the two thin-film wires 11 on the side of the high-temperature superconducting layer 14 face each other and are in a non-fixed state). Further, the high-temperature superconducting conductor 10 is configured such that the thin film wires 11 are connected at both ends in the width direction to each other via conductive coupling members 20 over the longitudinal direction of each thin film wire 11 in a conductible state. Here, each conductive coupling member 20 is preferably a low melting point metal such as tin, a tin alloy, indium, and an indium alloy.

In the high-temperature superconducting conductor 10 of the first embodiment, the high-temperature superconducting layer 14 of each thin film wire 11 is sandwiched from the outside by the metal substrates 12, and the surface 19 of each thin film wire 11 on the side of the high-temperature superconducting layer 14 is configured in a non-fixed state. Accordingly, even when mechanical loads (such as bending, tension, and heating) in various directions are applied from the outside of the high-temperature superconducting conductor 10, the mechanical loads are supported by the high-strength metal substrate 12 and the stabilization layer 17, and thus the force in the peeling direction with respect to each thin film wire 11 is hardly transmitted to each high-temperature superconducting layer 14. For instance, even when the external force F acts in the pulling direction on the surface 18 of each stabilization layer 17 on the side of the metal substrate 12 that is the outer surface of the high-temperature superconducting conductor 10, the force F becomes a force to pull each conductive coupling member 20 via each stabilization layer 17 and each metal substrate 12 and is hardly exerted to a force of peeling off each high-temperature superconducting layer 14.

Figure 2:
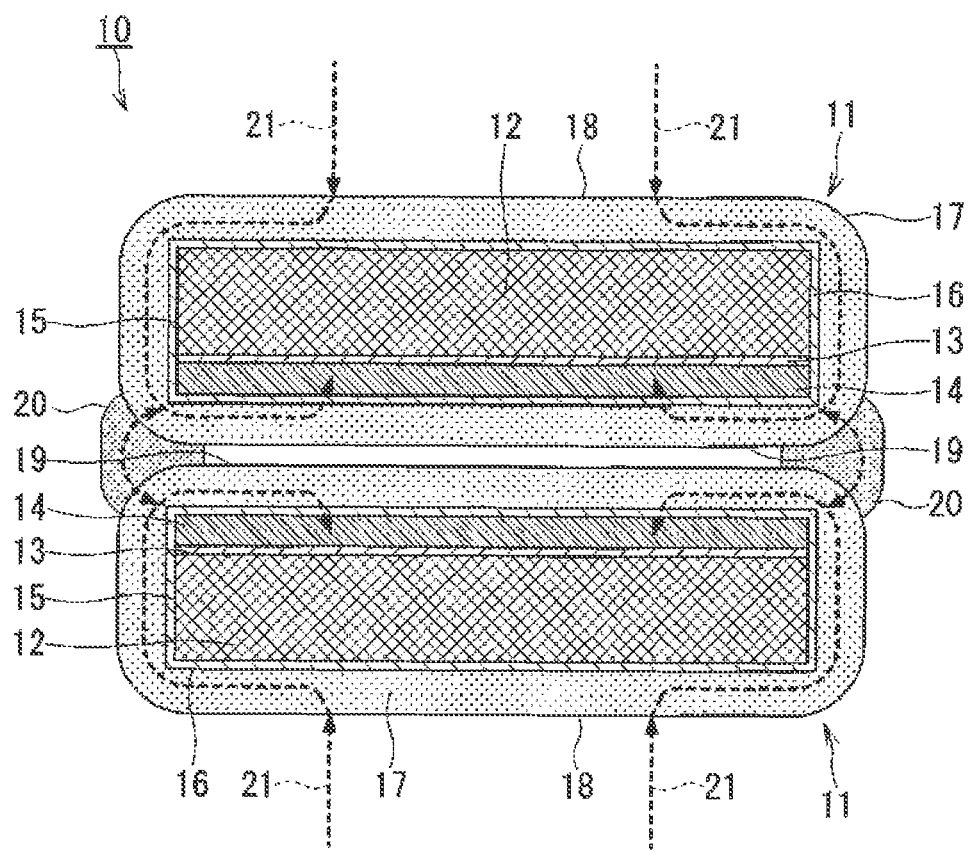
FIG. 2 is a transverse sectional view illustrating current flow of the high-temperature superconducting conductor shewn in FIG. 1.

In the high-temperature superconducting conductor 10, each stabilization layer 17 is formed so as to cover the entirety of each thin film wire 11. For this reason, an electric current 21 flows from the outer surface of the high-temperature superconducting conductor 10 to each high-temperature superconducting layer 14 via each stabilization layer 17 as shown in FIG. 2, and thus electric current can be easily introduced from the outside. Since the intermediate layer 13 formed between the metal substrate 12 and the high-temperature superconducting layer 14 of each of the two thin film wires 11 constituting the high-temperature superconducting conductor 10 is generally an electrical insulator, the electric current 21 cannot flow from the outer surface of the high-temperature superconducting conductor 10 in the stacking direction (thickness direction) of the thin film wire 11. In other words, the electric current 21 cannot flow in the order of the outer surface, the stabilization layer 17, the protective layer 16, the metal substrate 12, the intermediate layer 13, and the high-temperature superconducting layer 14.

In addition, the high-temperature superconducting conductor 10 has a function of interchanging the electric currents 21 flowing through the two thin film wires 11 by electrically connecting the two thin film wires 11 to each other via the conductive coupling members 20. For instance, even when the electric current 21 flows from one side of the outer surface of the high-temperature superconducting conductor 10 (i.e., the surface 18 on the side of the metal substrate 12 in one of the thin film wires 11), the electric current 21 also flows to the other thin film wire 11 via the conductive coupling members 20. Further, even when there is a performance degradation portion where the critical current value locally is low in a part of one of the thin film wires 11 in the longitudinal direction and thus the energization current value is likely to exceed the critical current value in the performance deterioration portion, the electric current 21 diverts to the other thin film wire 11 via the conductive coupling members 20. For this reason, it is possible to prevent the performance deterioration portion from changing to a normal conductor, and thermal runaway is less likely to occur in the high-temperature superconducting conductor 10.

Figure 3:
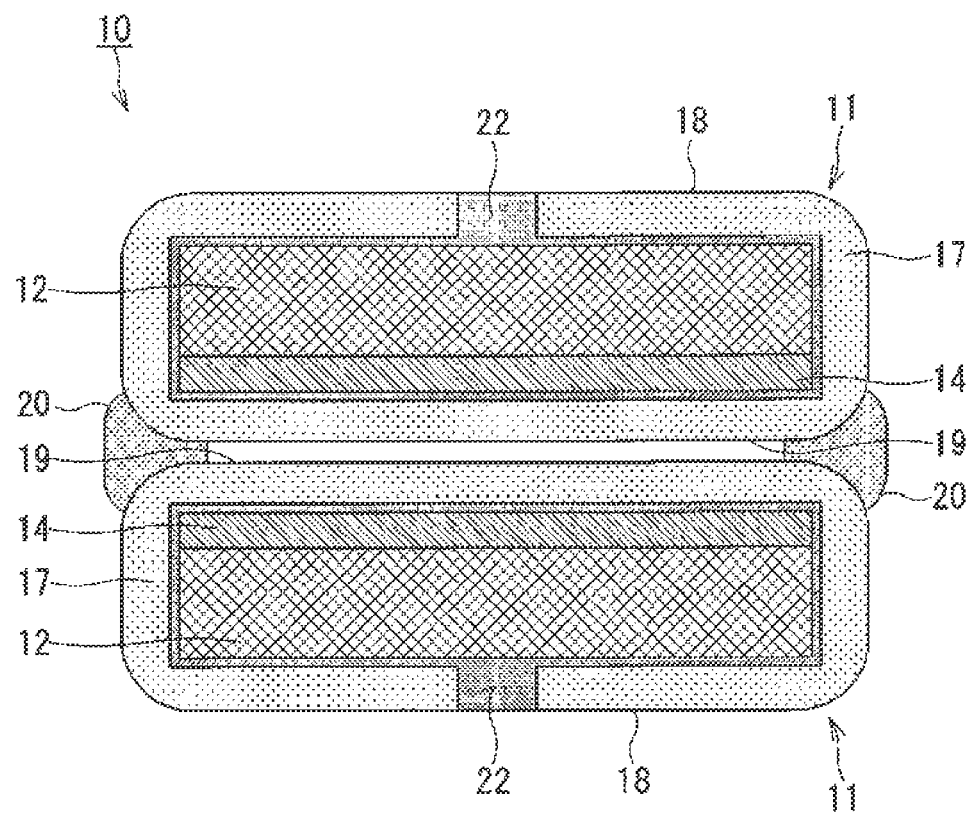
FIG. 3 is a transverse sectional view illustrating a first modification of the high-temperature superconducting conductor shown in FIG. 1.

Here, the stabilization layer 17 of each thin film wire 11 may be formed by plating a low resistance metal such as copper or may be formed by fixing a tape material such as copper through a brazing material 22 as shown in FIG. 3 illustrating the first modification. As the brazing material 22, a low melting point metal such as tin, a tin alloy, indium, and an indium alloy is preferable.

Figure 4:
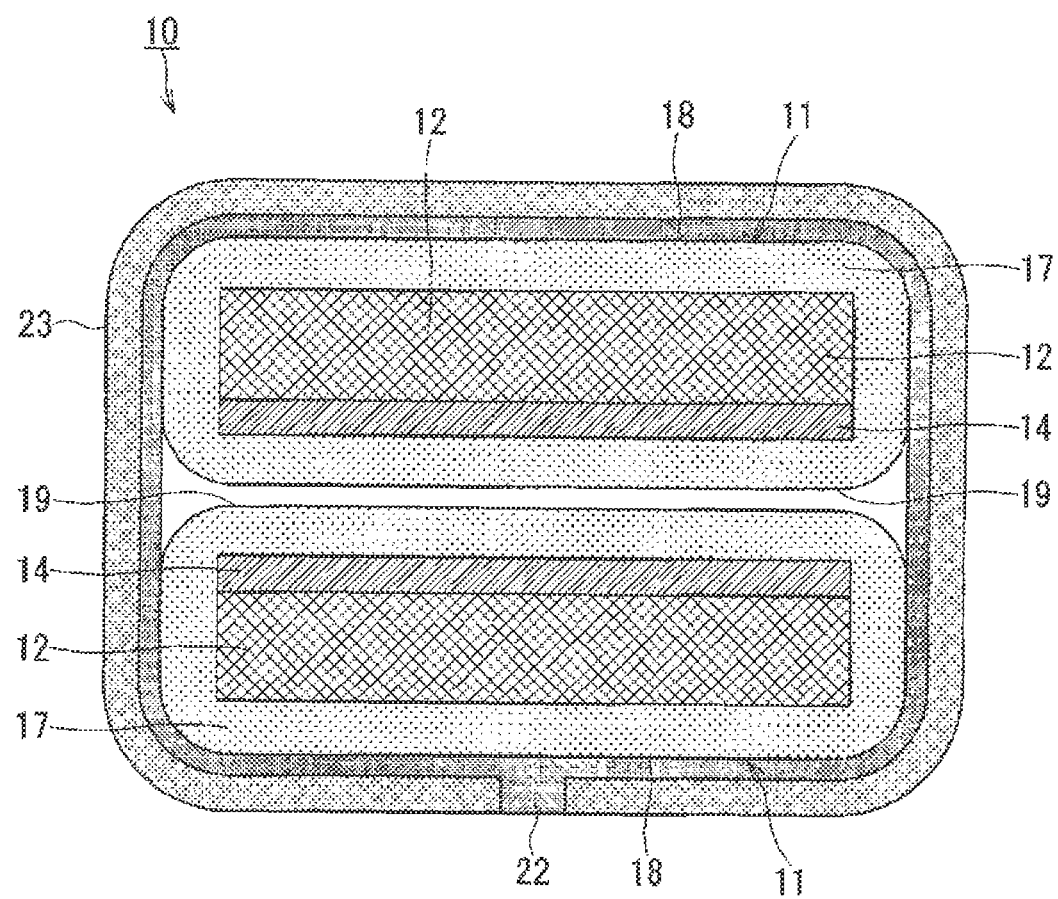
FIG. 4 is a transverse sectional view illustrating a second modification of the high-temperature superconducting conductor shown in FIG. 1.

Instead of fixing the two thin film wires 11 to each other only at both end portions in the width direction (i.e., at both end portions of the cross-section) with the use of the conductive coupling members 20, the two thin film wires 11 may be covered with a tape-shaped conductive coupling member 23 made of, e.g., copper so as to be fixed to the conductive coupling member 23 with the use of the brazing material 22 as shown in FIG. 4 illustrating the second modification. Additionally or alternatively, the entirety of the two thin film wires 11 may be plated with, e.g., copper. When the conductive coupling member 23 is used or the entirety of the two thin film wires 11 is plated, the two thin film wires 11 are coupled to each other at the periphery including both end portions in the width direction.

Figure 5:
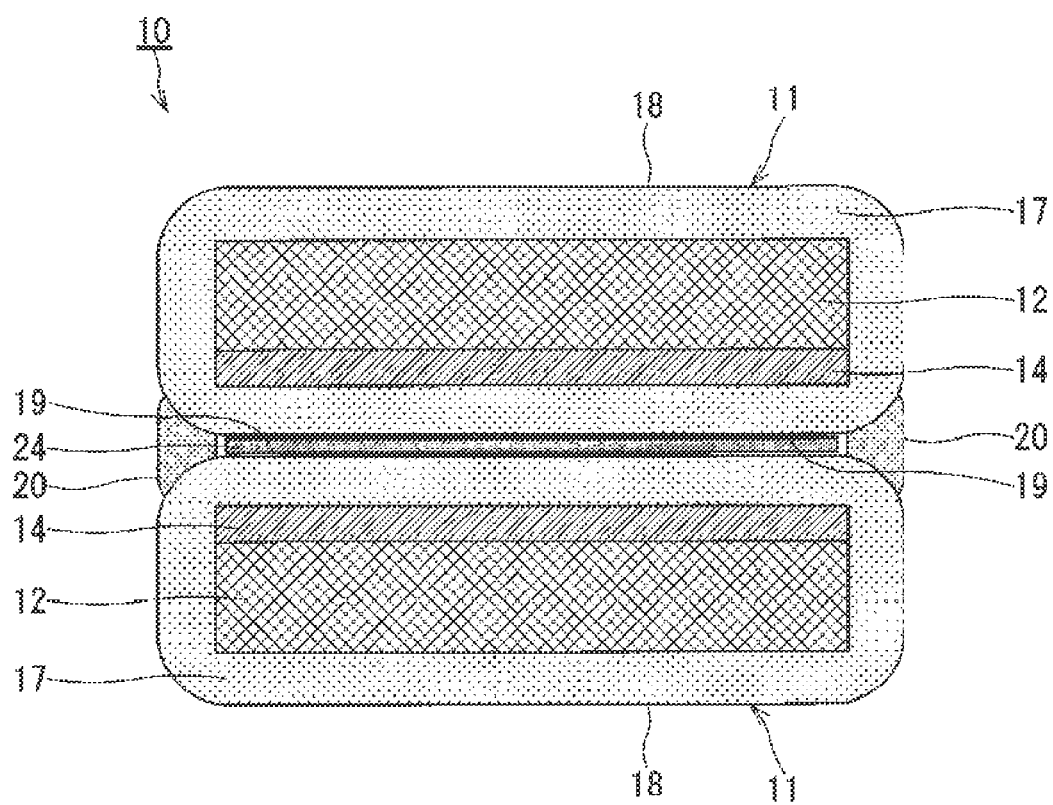
FIG. 5 is a transverse sectional view illustrating a third modification of the high-temperature superconducting conductor shown in FIG. 1.

In the high-temperature superconducting conductor 10, it is important that the surface 19 of the stabilization layer 17 on the side of the high-temperature superconducting layer 14 in one thin film wire 11 is held in a non-fixed state with respect to the surface 19 of the stabilization layer 17 on the side of the high-temperature superconducting layer 14 in the other thin film wire 11. However, when the conductive coupling members 20 in FIG. 1 to FIG. 3 and the brazing filler metal 22 in FIG. 4 largely protrude, there is a possibility that the respective surfaces 19 on the side of the high-temperature superconducting layers 14 of the two thin film wires 11 facing each other are fixed in a wide range. In order to prevent this, a sticking prevention member 24 may be interposed between the two thin film wires 11 as shown in FIG. 5 that illustrates the third modification. The sticking prevention member 24 is preferably formed by using a polymer material such as fluororesin and polyimide or by using metal that does not adhere to the conductive coupling members 20 and the brazing material 22, such as aluminum and stainless steel.

In the high-temperature superconducting conductor 10, the number of the thin film wires 11 need not be two, and three or more thin film wires 11 may be used for forming the high-temperature superconducting conductor 10. Further, for the purpose of manufacturability, reinforcement, and protection, a stainless steel tape and/or a copper tape may be interposed between the plural thin film wires 11. In this case, the thin film wire 11 arranged at the outermost side in the high-temperature superconducting conductor 10 is required to be positioned such that the surface 18 on the side of the metal substrate 12 becomes the outer surface, and each of the thin film wires 11 is required to be held such that the surface 19 of the stabilization layer 17 on the side of the high-temperature superconducting layer 14 is unfixed with respect to the opposing surface.

According to the configuration of the first embodiment as described above, the following effects (1) to (4) are obtained.

(1) In the high-temperature superconducting conductor 10 formed by arranging plural (e.g., two) thin film wires 11 in the thickness direction as shown in FIG. 1, the thin film wire 11 arranged on the outermost side is positioned so as to direct its surface 18 on the side of the metal substrate 12 outward, and the surface 19 on the side of the high-temperature superconducting layer 14 of each thin film wire 11 is held in a non-fixed state with respect to the surface 19 on the side of the high-temperature superconducting layer 14 of the opposing thin film wire 11. Thus, when a mechanical load is applied to the high-temperature superconducting conductor 10 from the outside and the force F acts on the surface 18 of the stabilization layer 17 on the side of the metal substrate 12 of each thin film wire 11, it is possible to suppress the force F from acting as a force in the peeling direction on the high-temperature superconducting layer 14 of each thin film wire 11. As a result, breakage of each high-temperature superconducting layer 14 against an external mechanical load can be prevented, and thus the reliability of the high-temperature superconducting conductor 10 can be secured.

(2) The high-temperature superconducting conductor 10 is configured by arranging the plural (e.g., two) thin film wires 11 in the thickness direction such that the plural thin film wires 11 are connected at both ends in the width direction to each other in the longitudinal direction in a conductible state via the conductive coupling members 20 and 23. Thus, the proportion of the components except the thin film wires 11 is small in the cross-sectional area perpendicular to the longitudinal direction of the high-temperature superconducting conductor 10. As a result, the critical current density in the cross-section of the high-temperature superconducting conductor 10 can be satisfactorily secured without being decreased.

(3) As shown in FIG. 1 and FIG. 4, the high-temperature superconducting conductor 10 is configured by using the thin film wires 11, each of which has the stabilization layer 17 formed therearound, in such a manner that the thin film wires 11 are connected at both ends in the width direction to each other via the conductive coupling members 20 or 23 in a conductible state in the longitudinal direction. Accordingly, it is possible to easily make the electric current 21 flow from the outer surface of the high-temperature superconducting conductor 10 to the high-temperature superconducting layer 14 of each thin film wire 11 through the stabilization layer 17 of each thin film wire 11, and thus the electric current 21 can be interchanged between the two thin film wires 11 by the conductive coupling members 20 or 23. As a result, it is easy to introduce an electric current from the outside of the high-temperature superconducting conductor 10, and it is also possible to prevent the electric current 21 exceeding a lower critical current value from flowing into the performance deterioration portion of the thin film wires 11 having the lower critical current value and to prevent the performance deterioration portion from changing to a normal conductor. Hence, occurrence of thermal runaway in the high-temperature superconducting conductor 10 can be prevented.

(4) When the sticking prevention member 24 is interposed between the thin film wires 11 of the high-temperature superconducting conductor 10 as shown in FIG. 5, it is possible to prevent the surface 19 on the side of the high-temperature superconducting layer 14 of the opposing thin film wire 11 from sticking over a wide range by the conductive coupling members 20 or the brazing material 22, and thus it is possible to reliably hold the non-fixed state. As a result, the reliability of the high-temperature superconducting conductor 10 with respect to a mechanical load can be improved.

[B] Second Embodiment (FIG. 6A to FIG. 8)

FIG. 6A is an overall cross-sectional view illustrating one embodiment of a high-temperature superconducting coil according to the present invention, and FIG. 6B is an enlarged cross-sectional view illustrating the part A in FIG. 6A in an enlarged manner.

The high-temperature superconducting coil 30 shown in FIG. 6A and FIG. 6B is formed by laminating the tape-shaped high-temperature superconducting conductors 10 of the first embodiment on, e.g., a winding frame and winding them to produce pancake coils 31 and then stacking these pancake coils 31 such that their axial centers 0 match each other. The winding frame is not illustrated in FIG. 6A to FIG. 8.

In each of the pancake coils 31, the high-temperature superconducting conductors 10 and insulating tapes 32 are wound together, and the respective winding turns of the high-temperature superconducting conductors 10 and the insulating tapes 32 are impregnated and fixed by an insulating resin 33. Insulating materials 34 are disposed at both axial ends of each pancake coil 31, and a cooling plate 35 for cooling the high-temperature superconducting conductors 10 is installed outside the insulating materials 34. The cooling plate 35 is finally thermally connected to cooling means (e.g., a refrigerator) through various members.

When the high-temperature superconducting coil 30 impregnated with the resin 33 is cooled, a tensile stress is generated in the coil radial direction in the high-temperature superconducting coil 30 due to anisotropy of the thermal shrinkage ratio. This tensile stress acts as a force in the peeling direction for the high-temperature superconducting conductors 10 of the high-temperature superconducting coil 30. However, the high-temperature superconducting coil 30 is wound by using the high-temperature superconducting conductors 10 that hardly transmit the force to the high-temperature superconducting layer 14 of each thin film wire 11 even if the force in the peeling direction is applied. Thus, in the high-temperature superconducting coil 30, the superconducting characteristics of the high-temperature superconducting coil 30 will not be deteriorated due to breakage of the high-temperature superconducting layers 14 of the thin film wires 11 in each high-temperature superconducting conductor 10 constituting the high-temperature superconducting coil 30.

In addition, the high-temperature superconducting coil 30 is also excellent in terms of cooling. In order to avoid breakage of the high-temperature superconducting layers 14 in the thin film wires 11 of each high-temperature superconducting conductor 10 constituting the high-temperature superconducting coil 30, there is a structure that prevents the force in the peeling direction from acting on the high-temperature superconducting layers 14 by subjecting the winding turns of the high-temperature superconducting coil 30 to release treatment without being fixed by the resin 33. In this structure, it becomes difficult to transmit heat at the release portion, and thus cooling of the thin film wires 11 may be insufficient. However, in the high-temperature superconducting coil 30 of the present embodiment, the high-temperature superconducting layer 14 of each thin film wire 11 is not damaged even when the high-temperature superconducting conductors 10 and the insulating tapes 32 of the winding turns are fixed to the surrounding components (such as the insulating materials 34 and the cooling plate 35) by using the resin 33. Thus, since there is no separating portion that inhibits the heat flow 36 around the high-temperature superconducting conductors 10 constituting the high-temperature superconducting coil 30, the high-temperature superconducting conductor 10 can be reliably cooled.

Figure 7:
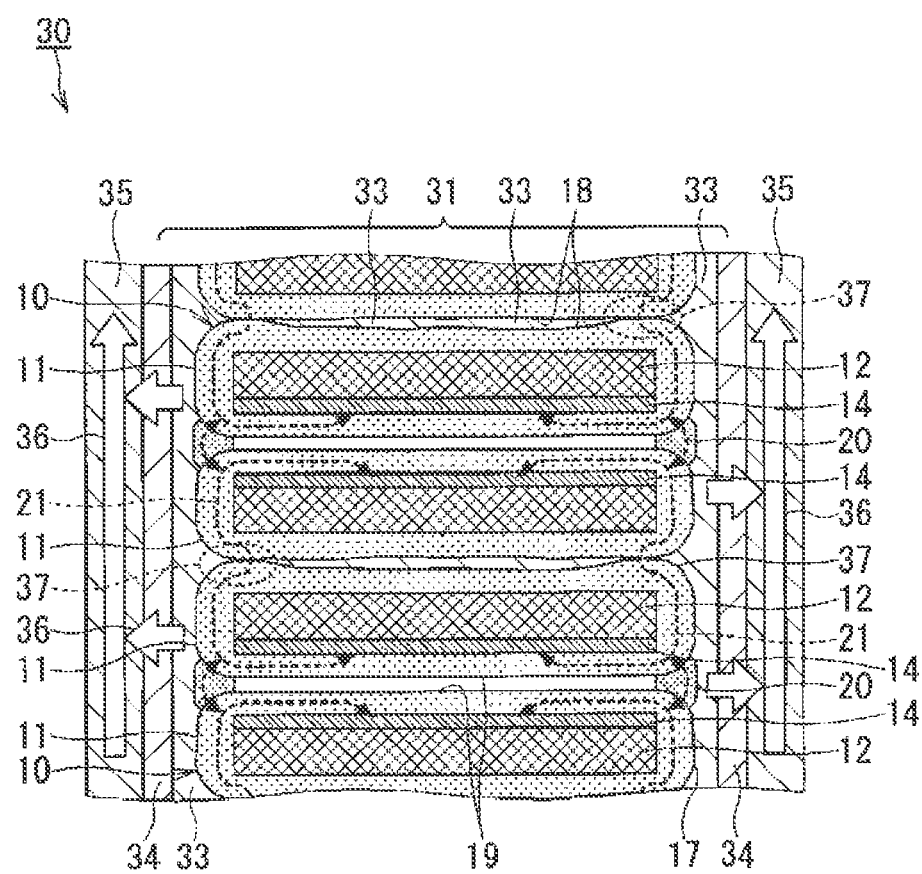
FIG. 7 is a partially enlarged cross-sectional view illustrating a first modification of the high-temperature superconducting coil shown in FIG. 6A and FIG. 6B.

In addition, the high-temperature superconducting coil 30 functions as a non-insulated coil electrically connecting the winding turns. FIG. 7 illustrates a winding configuration of the first modification of the high-temperature superconducting coil 30 configured as a non-insulated coil. In this high-temperature superconducting coil 30, the insulating tape 32 is not interposed between the adjacent high-temperature superconducting conductors 10 and each winding turn composed only of the high-temperature superconducting conductor(s) 10 is fixed by the resin 33 and is electrically conductively provided by the turn-to-turn contact portions 37 that extend in the longitudinal direction of the high-temperature superconducting conductors 10.

In the first modification shown in FIG. 7, each high-temperature superconducting conductor 10 constituting the high-temperature superconducting coil 30 has such a function that the force in the peeling direction does not act on the high-temperature superconducting layer 14 of each thin film wire 11. Thus, it is possible to bring the adjacent winding turns of the high-temperature superconducting conductors 10 into contact with each other by using the resin 33 and to fill and fix the gap with, e.g., resin. Additionally, it is also possible to ensure electrical conduction between the winding turns by the turn-to-turn contact portions 37 and to make it into a non-insulated coil. The contact electric resistance value of each turn-to-turn contact portion 37 is several times to several orders of magnitude larger than the electric resistance value of the conductive coupling members 20 that electrically connect the thin film wires 11.

In order to avoid breakage of the high-temperature superconducting layers 14 of the thin film wires 11 in each high-temperature superconducting conductor 10 constituting the high-temperature superconducting coil 30, there is also a means in which the winding turns of the high-temperature superconducting conductors 10 are not fixed by using the resin 33 (i.e., conductors 10 are released) for preventing the force in the peeling direction from acting on the high-temperature superconducting layers 14 of the thin film wires 11. In this means, however, the electrical continuity between the winding turns disappears or becomes unreliable due to the releasing portion, which makes it impossible to establish the high-temperature superconducting coil 30 as a non-insulated coil.

Figure 8:
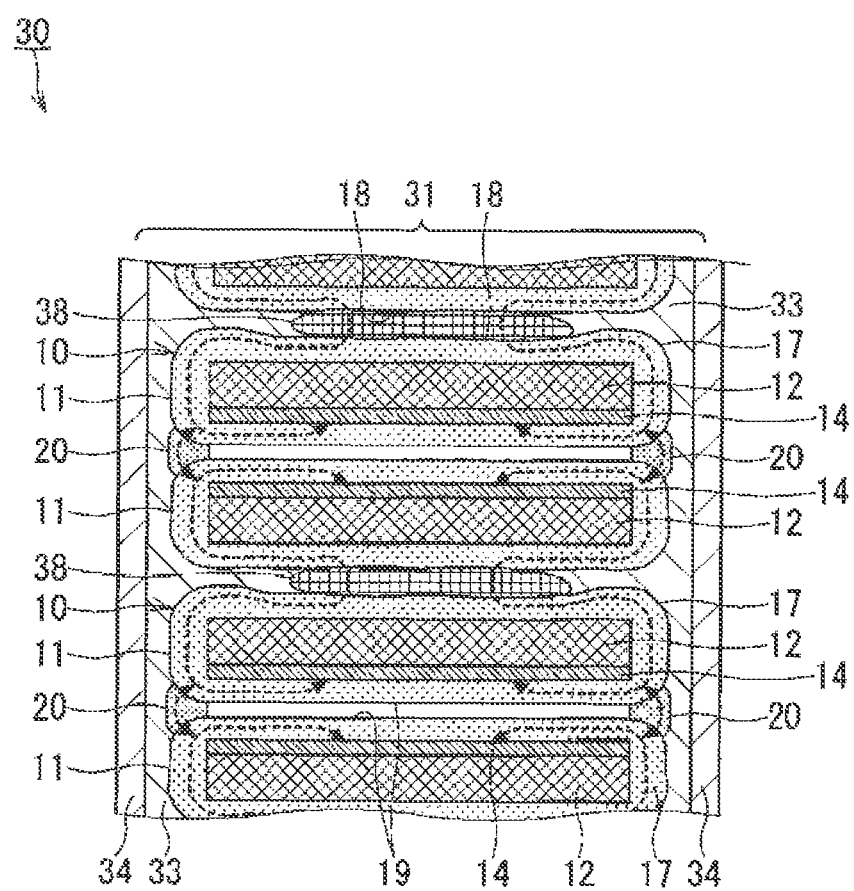
FIG. 8 is a partially enlarged cross-sectional view illustrating a second modification of the high-temperature superconducting coil shown in FIG. 6A and FIG. 6B.

As a means for ensuring electrical conduction between the winding turns of the high-temperature superconducting conductors 10, the following means may be adopted instead of directly contacting the adjacent high-temperature superconducting conductors 10 by the turn-to-turn contact portions 37 shown in FIG. 7. That is, the electric conduction members 38 co-wound with the high-temperature superconducting conductors 10 may be arranged between adjacent winding turns of the high-temperature superconducting conductors 10 as shown in FIG. 8 that illustrates the second modification of the high-temperature superconducting coil 30. Since each electrical conduction member 38 is a conductive material and is required to obtain a satisfactory contact state with the high-temperature superconducting conductor(s) 10, each electrical conduction members 38 is preferably formed of, e.g., a soft metal such as indium, a metal gauze such as copper and stainless steel, and a carbon fiber. By appropriately selecting the electric conduction members 38, it is possible to change the contact state between the electric conduction members 38 and the high-temperature superconducting conductors 10 and to change the electric resistance value between the high-temperature superconducting conductors 10.

According to the configuration of the second embodiment as described above, the following effects (5) to (8) are obtained in the second embodiment.

(5) As shown in FIG. 6A to FIG. 8, the high-temperature superconducting coil 30 is configured by using the high-temperature superconducting conductors 10 that hardly transmit the force in the peeling direction to the high-temperature superconducting layers 14 of the thin film wires 11 even when this force acts. Accordingly, even when the force in the peeling direction acts on the thin film wires 11 of each high-temperature superconducting conductor 10 constituting the superconducting coil 30 due to the mechanical load acting on the superconducting coil 30 in the manufacturing process or the usage situation of the superconducting coil 30, this force is hardly transmitted to the high-temperature superconducting layers 14 of the thin film wires 11 and thus breakage of the high-temperature superconducting layers 14 of the high-temperature superconducting coil 30 can be prevented. As a result, the superconducting characteristics of the high-temperature superconducting coil 30 can be satisfactorily secured without being deteriorated.

(6) As shown in FIG. 6A to FIG. 8, the high-temperature superconducting coil 30 is configured by using the high-temperature superconducting conductors 10 that hardly transmit the force in the peeling direction to the high-temperature superconducting layers 14 of the thin film wires 11 even when this force acts. Thus, in order to avoid breakage of the high-temperature superconducting layers 14 of the thin film wires 11 in each high-temperature superconducting conductor 10 constituting the high-temperature superconducting coil 30 due to the force in the peeling direction, it is unnecessary to form a release portion for preventing each winding turn of the high-temperature superconducting conductors 10 from being fixed by the resin 33. Hence, since the high-temperature superconducting conductors 10 and the surrounding components (such as the insulating materials 34 and the cooling plate 35) in the high-temperature superconducting coil 30 can be fixed to each other by the resin 33, the heat flow 36 is not hindered. As a result, the cooling performance of the high-temperature superconducting conductors 10 of the high-temperature superconducting coil 30 can be improved.

(7) As shown in FIG. 7, the high-temperature superconducting coil 30 is configured by using the high-temperature superconducting conductors 10 that hardly transmit the force in the peeling direction to the high-temperature superconducting layers 14 of the thin film wires 11 even when this force acts. Thus, the respective winding turns of the high-temperature superconducting conductors 10 constituting the high-temperature superconducting coil 30 are fixed by the resin 33, and the adjacent winding turns of the high-temperature superconducting conductors 10 are conductively contacted by the turn-to-turn contact portions 37. As a result, the high-temperature superconducting coil 30 can be configured as a non-insulated coil in which the winding turns are electrically conducted.

(8) As shown in FIG. 8, the respective winding turns of the high-temperature superconducting conductors 10 constituting the high-temperature superconducting coil 30 are fixed by the resin 33. Further, between the adjacent winding turns of the high-temperature superconducting conductors 10, the electric conduction members 38 made of a conductive material are arranged so as to contact the high-temperature superconducting conductors 10. Since the electric resistance value between the winding turns of the high-temperature superconducting conductors 10 can be easily changed by appropriately selecting the electric conduction members 38, it is possible to enhance the functionality of the high-temperature superconducting coil 30 as a non-insulated coil.

[C] Third Embodiment (FIG. 9A to FIG. 13)

Figure 9B:
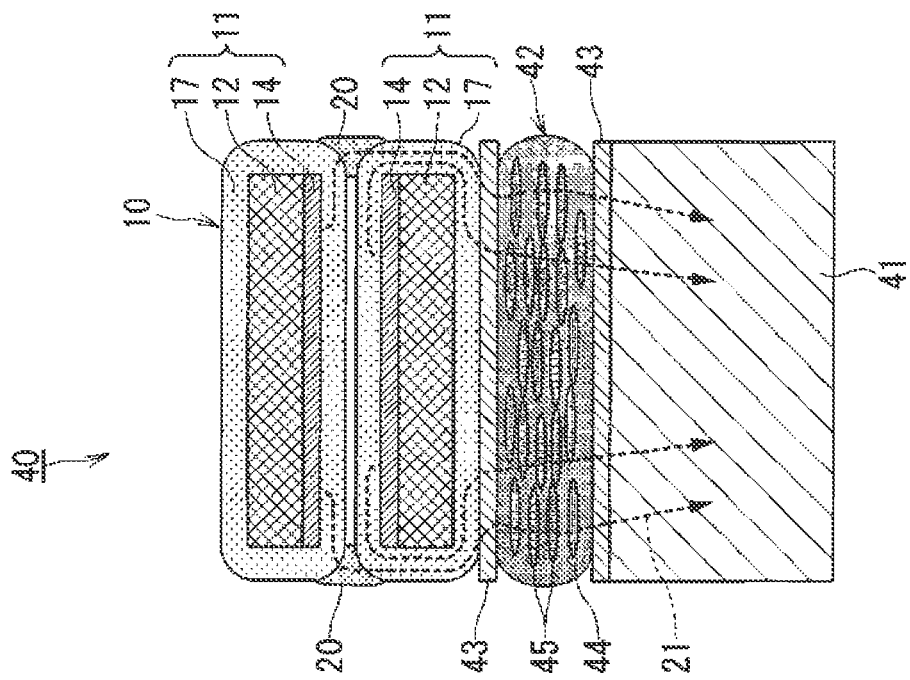
FIG. 9B is a transverse sectional view illustrating the connecting structure of the high-temperature superconducting coil shown in FIG. 9A.
Figure 9A:
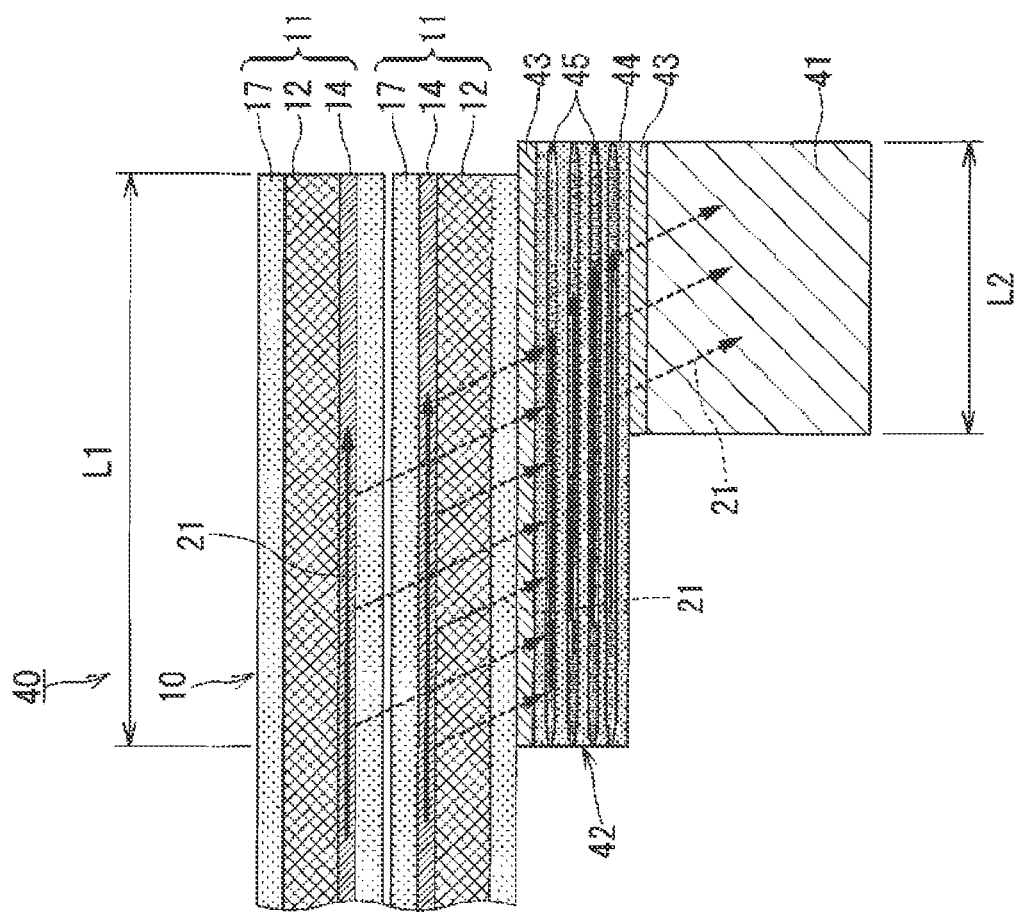
FIG. 9A is a longitudinal sectional view illustrating one embodiment of a connecting structure of a high-temperature superconducting coil according to the present invention.

FIG. 9A is a longitudinal sectional view illustrating one embodiment of a connecting structure of a high-temperature superconducting coil according to the present invention, and FIG. 9B is a transverse sectional view illustrating the connecting structure of the high-temperature superconducting coil shown in FIG. 9A. The connecting structure 40 of the high-temperature superconducting coil shown in FIG. 9 is a structure in which a metal conductor 41 is electrically connected to the lengthwise end portion of the high-temperature superconducting conductor 10 in the high-temperature superconducting coil 30 of the second embodiment via a high-temperature superconducting silver sheath wire. Hereinafter, the high-temperature superconducting silver sheath wire is referred to as the silver sheath wire 42.

In other words, the connecting structure 40 is formed in such a manner that (a) the silver sheath wire 42 is electrically connected to the lengthwise end portion of the high-temperature superconducting conductor 10 constituting the high-temperature superconducting coil 30 in parallel with the high-temperature superconducting conductor 10 by using solder 43 and (b) the metal conductor 41 is electrically connected to this silver sheath wire 42 by using the solder 43. Further, the connection length L1 between the silver sheath wire 42 and the high-temperature superconducting conductor 10 of the high-temperature superconducting coil 30 is set to be longer than the connection length L2 between the silver sheath wire 42 and the metal conductor 41. This is so that the connection length between the high-temperature superconducting conductor 10 and the metal conductor 41 becomes substantially longer by the silver sheath wire 42.

Figure 10:
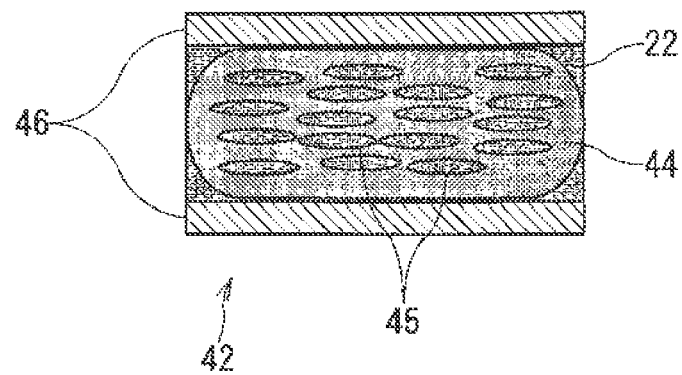
FIG. 10 is a transverse sectional view illustrating a modification of the silver sheath wire shown in FIG. 9A and FIG. 9B.

Although the silver sheath wire 42 is in the form of a tape similarly to the thin film wires 11, the internal structure of the silver sheath wire 42 is largely different from that of the thin film wires 11. That is, the silver sheath wire 42 is not a laminated structure like the thin film wires 11 but has a structure in which a high-temperature superconducting filament 45 is embedded and mixed in a silver matrix 44 as the base material. $Bi_2Sr_2Ca_2Cu_3O_{10}$ is used for the material of the high-temperature superconducting filament 45 of the silver sheath wire 42 that has been put to practical use. Further, as to the silver sheath wire 42, it is possible to use such a silver sheath wire that reinforcing members 46 are fixed to the front and rear surfaces of the silver sheath wire by using, e.g., the brazing material 22 for reinforcement as shown in FIG. 10.

As the material of the solder 43, a low melting point metal such as tin, a tin alloy, indium, and an indium alloy is suitable. For the connection between the high-temperature superconducting conductor 10 and the silver sheath wire 42 and for the connection between the silver sheath wire 42 and the metal conductor 41, solders 43 of different materials may be used in view of, e.g., ease of manufacture.

Figure 11:
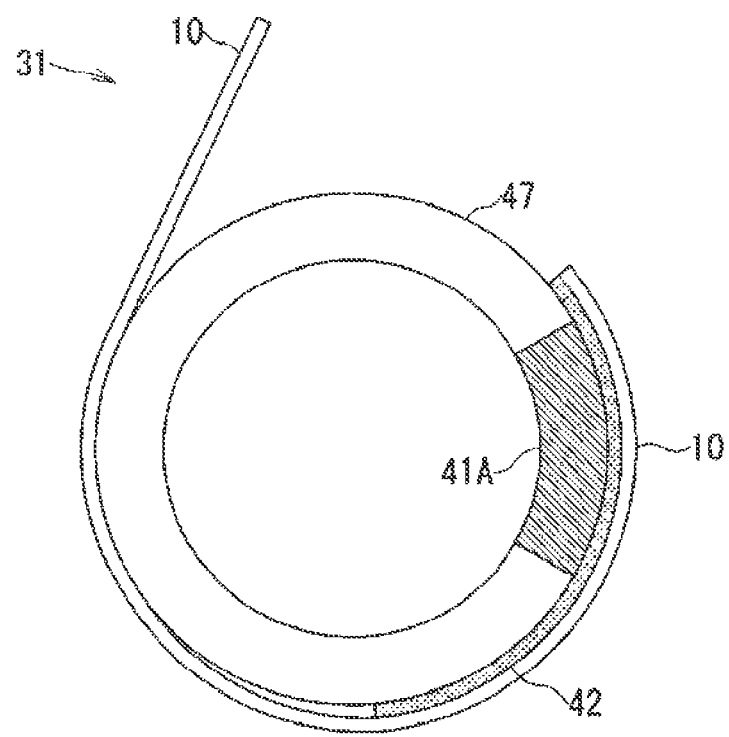
FIG. 11 is a plan view illustrating components such as a winding frame of a high-temperature superconducting coil equipped with a lead-out electrode as an example of a metal conductor shown in FIG. 9A and FIG. 9B.
Figure 12:
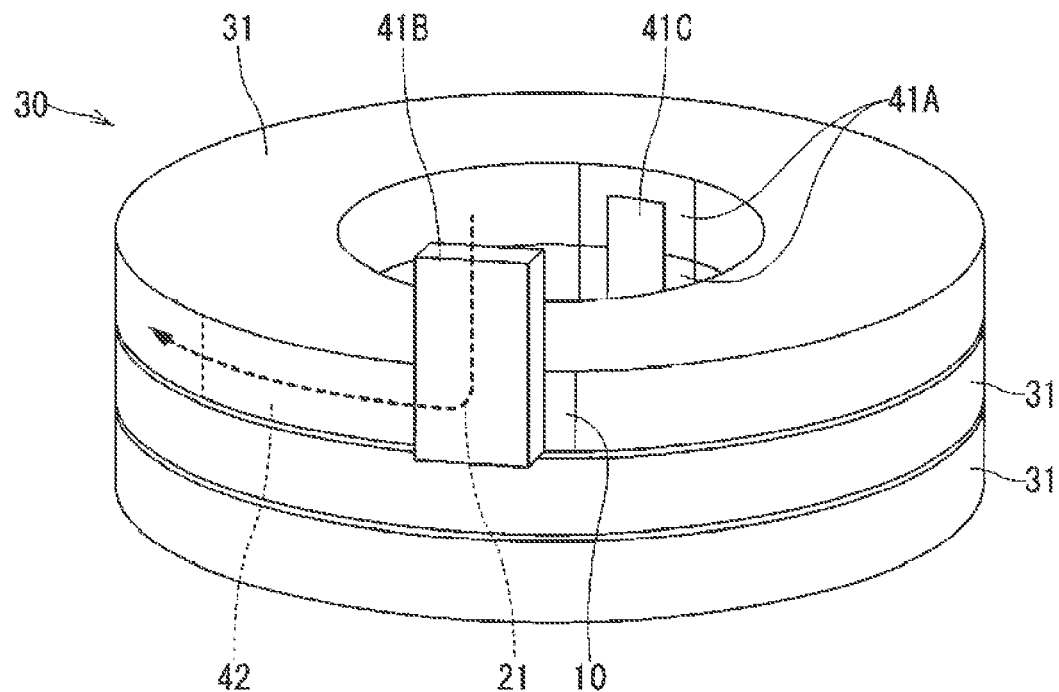
FIG. 12 is a perspective view illustrating a high-temperature superconducting coil provided with a lead-out electrode as another example of the metal conductor shown in FIG. 9A and FIG. 9B.
Figure 13:
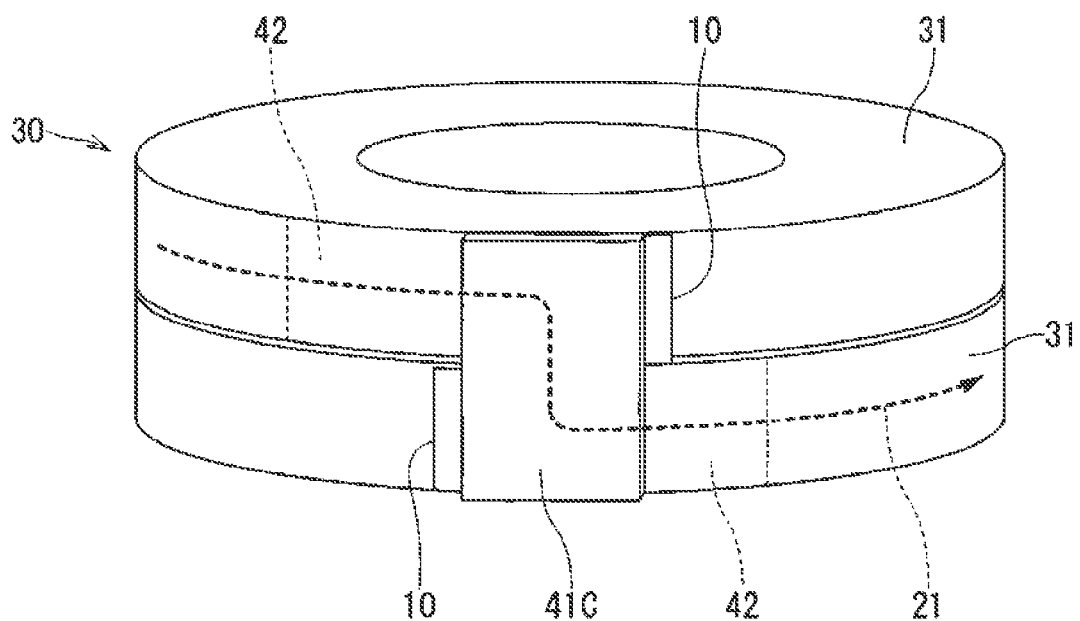
FIG. 13 is a perspective view illustrating a high-temperature superconducting coil provided with a connecting conductor as still another example of the metal conductor shown in FIG. 9A and FIG. 9B.

The metal conductor 41 is, e.g., a lead-out electrode 41A fixed to a winding frame 47 in order to start winding the high-temperature superconducting conductor 10 as shown in FIG. 11. Additionally or alternatively, the metal conductor 41 may be a lead-out electrode 41B for introducing an electric current at the winding finish portion as shown in FIG. 12. Additionally or alternatively, the metal conductor 41 may be a connecting conductor 41C between the pancake coils 31 as shown in FIG. 13. Although a low resistance metal such as silver and copper is used for the material of the metal conductor 41, the thin film wire 11 and the silver sheath wire 42 may be used for the metal conductor 41.

When the outer surface of the high-temperature superconducting conductor 10 and the metal conductor 41 are electrically directly connected to each other without the silver sheath wire 42, the outer surface of the high-temperature superconducting conductor 10 is the surface 18 of the stabilization layer 17 on the side of the metal substrate 12 of the thin film wire 11 and thus the electric current 21 flows to the high-temperature superconducting layer 14 through the thin stabilization layer 17 of approximately several tens of micrometers in the thin film wire 11. Hence, as compared with the case where the metal conductor 41 is directly connected to the stabilization layer 17 on the side of the high-temperature superconducting layer 14 of the thin film wire 11 as is done with the ordinary thin film wire 11, the following point is established. That is, when the outer surface of the high-temperature superconducting conductor 10 and the metal conductor 41 are directly connected to each other without the silver sheath wire 42, the distance through which the electric current 21 flows becomes longer and the cross-sectional area through which the electric current 21 flows becomes smaller, so that the electrical resistance of the connection portion between the high-temperature superconducting conductor 10 and the metal conductor 41 increases and heat generation increases.

When the high-temperature superconducting conductor 10 and the metal conductor 41 are connected to each other without this silver sheath wire 42, it is possible to connect both with a low electric resistance value in the case where the connection length is increased from several hundred mm to about 1 m. However, it is usually difficult to make the length of the metal conductor 41 used for the lead-out electrodes 41A and 41B and the connection conductor 41C to be about 100 mm or more due to restrictions in terms of, e.g., size and manufacturing.

However, in the connecting structure 40 of the high-temperature superconducting coil according to the third embodiment, the silver sheath wire 42 has an electrical resistance in the longitudinal direction of substantially zero and it is possible to make the electric current 21 flow with a low electric resistance through the silver matrix 44 as a base material also in the direction (i.e., thickness direction) penetrating the rear surface and the front surface of the silver sheath wire 42. Thus, in the connection between the metal conductor 41 and the high-temperature superconducting conductor 10 of the high-temperature superconducting coil 30, the substantial connection length is increased by the silver sheath wire 42 and it becomes possible to electrically connect it with a low electric resistance value.

According to the configuration of the third embodiment as described above, the following effect (9) is obtained.

(9) The lengthwise end portion of the high-temperature superconducting conductor 10 of the high-temperature superconducting coil 30 is connected to the metal conductor 41 via the silver sheath wire 42 such that the connection length L1 between the high-temperature superconducting conductor 10 and the silver sheath wire 42 is set to be longer than the connection length L2 between the silver sheath wire 42 and the metal conductor 41, which lengthens the substantial connection length between the metal conductor 41 and the high-temperature superconducting conductor 10 of the high-temperature superconducting coil 30 by the silver sheath wire 42. As a result, the high-temperature superconducting conductor 10 and the metal conductor 41 can be connected to each other with a low electric resistance value, and thus heat generation at this connecting portion can be suppressed.

Although an embodiment of the present invention has been described, the present embodiment has been presented as an example and is not intended to limit the scope of the invention. This novel embodiment can be implemented in various other modes and various omissions, replacements or alterations can be made without departing from the spirit and scope of the present invention. The embodiment and modifications thereof are included in the scope and spirit of the present invention and also included in the invention described in the scope of the appended claims and within the range of equivalency thereof.

REFERENCE SIGNS LIST

10 . . . high-temperature superconducting conductor, 11 . . . thin film wire, 12 . . . metal substrate, 13 . . . middle layer, 14 . . . high-temperature superconducting layer, 15 . . . laminated body, 16 . . . protective layer, 17 . . . stabilization layer, 18 . . . the surface on the side of the metal substrate, 19 . . . the surface on the side of the high-temperature superconducting conductor, 20, 23 . . . conductive coupling member, 24 . . . sticking prevention member, 30 . . . high-temperature superconducting coil, 33 . . . resin, 37 . . . turn-to-turn contact portion, 38 . . . electric conduction member, 40 . . . connecting structure of high-temperature superconducting conductor, 41 . . . metal conductor, 42 . . . silver sheath wire, 44 . . . silver matrix, 45 . . . high-temperature superconducting filament, 47 . . . winding frame, L1, L2 . . . connection length

The invention claimed is:

1. A high-temperature superconducting conductor in which a laminated body is formed by laminating a high-temperature superconducting layer on one side surface of a flexible and tape-shaped metal substrate via an intermediate layer and a plurality of thin film wires are formed by providing a stabilization layer around the laminated body via a protective layer and are arranged in a thickness direction,
wherein the plurality of thin film wires are connected at both ends in a width direction to each other in a conductible state in a longitudinal direction, in such a manner that a thin film wire disposed at an outermost side is positioned with a surface on a side of the metal substrate directed outward and a surface of each of the plurality of thin film wires facing the high-temperature superconducting layer is held in a non-fixed state with respect to an opposing surface.

2. The high-temperature superconducting conductor according to claim 1,
wherein a sticking prevention member is interposed between a surface on a side of the high-temperature superconducting layer of each of the plurality of thin film wires and a surface that faces the surface on a side of the high-temperature superconducting layer for preventing adhesion of both surfaces.

3. A high-temperature superconducting coil configured by winding the high-temperature superconducting conductor according to claim 1.

4. The high-temperature superconducting coil according to claim 3,
    wherein each winding turn of the high-temperature superconducting conductor is fixed by impregnation with an insulating resin.

5. The high-temperature superconducting coil according to claim 3,
    wherein turn-to-turn contact portions are provided in such a manner that adjacent winding turns of the high-temperature superconducting conductor become conductible.

6. The high-temperature superconducting coil according to claim 3,
    wherein an electric conduction member made of a conductive material is disposed between adjacent winding turns of the high-temperature superconducting conductor in such a manner that the electric conduction member is in contact with the high-temperature superconducting conductor.

7. A connecting structure of a high-temperature superconducting coil configured by connecting a lengthwise end portion of a high-temperature superconducting conductor constituting the high-temperature superconducting coil of claim 3 to a metal conductor via a silver sheath wire that is formed by embedding a high-temperature superconducting filament in a silver matrix.

8. The connecting structure of a high-temperature superconducting coil according to claim 7,
    wherein a connection length between the high-temperature superconducting conductor and the silver sheath wire is set to be longer than a connection length between the silver sheath wire and the metal conductor.

* * * * *